United States Patent
Wang et al.

(10) Patent No.: US 10,211,598 B2
(45) Date of Patent: Feb. 19, 2019

(54) SIDE-VIEW LIGHT EMITTING LASER ELEMENT

(71) Applicant: Lextar Electronics Corporation, Hsinchu (TW)

(72) Inventors: Te-Chung Wang, Taichung (TW); Shiou-Yi Kuo, Kaohsiung (TW); Jun-Rong Chen, Hsinchu County (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/638,356

(22) Filed: Jun. 29, 2017

(65) Prior Publication Data

US 2018/0019575 A1    Jan. 18, 2018

(30) Foreign Application Priority Data

Jul. 5, 2016    (TW) .............................. 105121257 A

(51) Int. Cl.
| | |
|---|---|
| H01S 5/32 | (2006.01) |
| H01L 33/60 | (2010.01) |
| H01S 5/042 | (2006.01) |
| H01S 5/18 | (2006.01) |
| H01S 5/20 | (2006.01) |

(52) U.S. Cl.
CPC ............ H01S 5/3211 (2013.01); H01L 33/60 (2013.01); H01S 5/0425 (2013.01); H01S 5/18 (2013.01); H01S 5/20 (2013.01)

(58) Field of Classification Search
CPC ........ H01S 5/3211; H01S 5/18; H01S 5/0425; H01L 33/60
USPC ......................................................... 257/103
See application file for complete search history.

(56) References Cited

U.S. PATENT DOCUMENTS

| | | | |
|---|---|---|---|
| 6,711,191 B1 | 3/2004 | Kozaki et al. | |
| 2015/0044795 A1* | 2/2015 | Futagawa | H01S 5/0217 438/29 |

FOREIGN PATENT DOCUMENTS

| | | |
|---|---|---|
| TW | 200950143 A | 12/2009 |
| TW | 201214750 A1 | 4/2012 |

* cited by examiner

*Primary Examiner* — Fernando L Toledo
*Assistant Examiner* — Adam S Bowen
(74) *Attorney, Agent, or Firm* — CKC & Partners Co., Ltd.

(57) ABSTRACT

A side-view light emitting laser element includes a support substrate, a first electrode layer, a second electrode layer, and a light emitting multilayer unit sandwiched between the first electrode layer and the second electrode layer. The first electrode layer is disposed on the support substrate. The second electrode layer is disposed on the first electrode layer. The light emitting multilayer unit includes a first semiconductor layer, a second semiconductor layer and an activating layer sandwiched between the first semiconductor layer and the second semiconductor layer. A first refractive index of the first electrode layer and a second refractive index of the second electrode layer are between 1 and 0, respectively.

11 Claims, 6 Drawing Sheets

SIDE-VIEW LIGHT EMITTING LASER ELEMENT

RELATED APPLICATIONS

This application claims priority to Taiwan Application Serial Number 105121257, filed Jul. 5, 2016, which is herein incorporated by reference.

BACKGROUND

Field of Disclosure

The present disclosure relates to a light emitting element. More particularly, the present disclosure relates to a side-view light emitting element.

Description of Related Art

In general, a semiconductor laser element is able to confine light waves generated by electrons and electron holes with a resonant cavity spaced to form between two cladding layers of a semiconductor laser element. By generating standing wave oscillation to form stimulated emissions and repeatedly enhance to a certain critical point, coherent light with the same phase, polarization and radiation direction can be stimulated.

However, when aluminum gallium nitride (AlGaN) is adopted as the cladding layers in a traditional semiconductor laser element, fragmentations or poor crystal quality of the cladding layers might occur so as to greatly affect yield, quality and product life of the traditional semiconductor laser element. Thus, the thickness of the cladding layers of the traditional semiconductor laser element must be controlled accurately. Otherwise, the light confinement ability of the cladding layers with overly lower thickness may be weakened, or the cladding layers with overly higher thickness may lead to being cracked easily.

SUMMARY

An aspect of the disclosure is to provide a side-view light emitting laser element for enhancing light emitting performances and product life thereof.

According to one embodiment, the side-view light emitting laser element includes a support substrate, a first electrode layer, a second electrode layer and a light emitting multilayer unit. The first electrode layer is disposed on the support substrate, and one surface of the first electrode layer opposite to the support substrate is partially formed with a first extending portion. The first extending portion has a first light reflection surface which is disposed on one surface of the first extending portion opposite to the support substrate. The second electrode layer is disposed on the first electrode layer. The light emitting multilayer unit is sandwiched between the first electrode layer and the second electrode layer. The second electrode layer fully covers the light emitting multilayer unit, the light emitting multilayer unit comprising a first semiconductor layer, a second semiconductor layer and an activating layer sandwiched between the first semiconductor layer and the second semiconductor layer. One surface of the second electrode layer facing towards the light emitting multilayer unit is partially formed with a second extending portion. The first extending portion and the second extending portion respectively extend towards the light emitting multilayer unit. The second extending portion has a second light reflection surface which is disposed on one surface of the second extending portion facing towards the support substrate. A first orthographic projection of the first light reflection surface to the support substrate is overlapped with a second orthographic projection of the second light reflection surface to the support substrate. A resonant cavity is defined between the second light reflection surface and the first light reflection surface for confining light waves and repeatedly oscillating the light waves so as to convert and discharge laser lights from the resonant cavity outwardly. A first refractive index of the first electrode layer and a second refractive index of the second electrode layer are between 1 and 0, respectively.

Thus, compared to the conventional arts in which the thickness of the cladding layers, the traditional semiconductor laser element is needed to be controlled accurately in order to prevent from reducing the light confinement ability of the cladding layers and the cladding layers getting cracked. Therefore, since the electrode (cladding) layers of the side-view light emitting laser element of the embodiment respectively are with better refractive index, not only the light confinement abilities of the side-view light emitting laser element can be increased, but also the side-view light emitting laser element will not be cracked easily.

In one or more embodiments of the disclosure, the first electrode layer is a silver layer or an aluminum layer, and the second electrode layer is a silver layer or an aluminum layer.

In one or more embodiments of the disclosure, the side-view light emitting laser element further includes a first insulation layer and a second insulation layer. The first insulation layer is disposed between the first electrode layer and the first semiconductor layer, and the first insulation layer is formed with a first interval space. The first light reflection surface is received in the first interval space. The second insulation layer is disposed between the second electrode layer and the second semiconductor layer, and the second insulation layer is formed with a second interval space. The second light reflection surface is received in the second interval space.

In one or more embodiments of the disclosure, the side-view light emitting laser element further includes a first conductive layer disposed between the first electrode layer and the first semiconductor layer. A third refractive index of the first conductive layer is in a range of 1 to 2.1.

In one or more embodiments of the disclosure, the first conductive layer is disposed between the first light reflection surface and the first semiconductor layer, and the first conductive layer is only entirely received in the first interval space.

In one or more embodiments of the disclosure, the first conductive layer fully covers the one surface of the first electrode layer and the first extending portion. One part of the first conductive layer is disposed in the first interval space, and is disposed between the first light reflection surface and the first semiconductor layer, and the other part of the first conductive layer is disposed between the one surface of the first electrode layer and the first insulation layer.

In one or more embodiments of the disclosure, the first conductive layer is levelly sandwiched between the first light reflection surface and the first semiconductor layer, and between the first insulation layer and one surface of the first semiconductor layer. The first conductive layer is totally disposed out of the first interval space, and the first conductive layer fully covers one surface of the first semiconductor layer opposite to the activating layer.

In one or more embodiments of the disclosure, the side-view light emitting laser element further includes a second conductive layer disposed between the second electrode layer and the second semiconductor layer. A fourth refractive index of the second conductive layer is in a range of 1 to 2.1.

In one or more embodiments of the disclosure, the second conductive layer is disposed between the second light reflection surface and the second semiconductor layer, and is only entirely received in the second interval space.

In one or more embodiments of the disclosure, the second conductive layer fully covers the one surface of the second electrode layer and the second extending portion. One part of the second conductive layer is disposed in the second interval space, and is disposed between the second light reflection surface and the second semiconductor layer, and the other part of the second conductive layer is disposed between the one surface of the second electrode layer and the second insulation layer.

In one or more embodiments of the disclosure, the second conductive layer is levelly sandwiched between the second light reflection surface and the second semiconductor layer, and between the second insulation layer and one surface of the second semiconductor layer. The second conductive layer is totally disposed out of the second interval space, and the second conductive layer fully covers one surface of the second semiconductor layer opposite to the activating layer.

In one or more embodiments of the disclosure, the side-view light emitting laser element includes a cuboid body, and the side-view light emitting laser element is provided with a short side-surface, and the resonant cavity is in an elongated shape. A first long axial direction of the cuboid body is parallel to a second long axial direction of the resonant cavity, and the laser light of the resonant cavity are discharged outwardly from the short side-surface of the side-view light emitting laser element.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
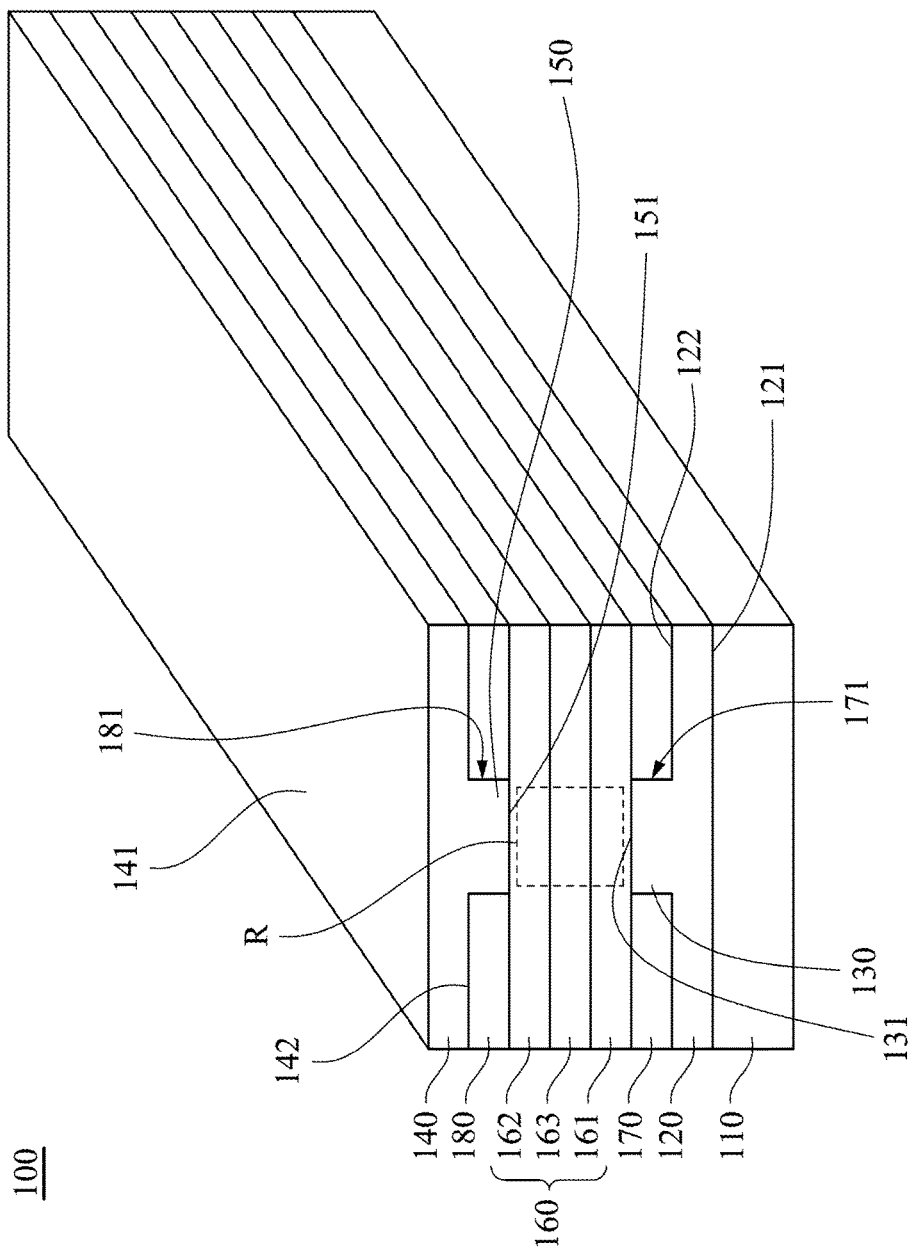
FIG. 1 is a three-dimensional sectional view of a side-view light emitting element according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Reference is now made to FIG. 1 in which FIG. 1 is a three-dimensional sectional view of a side-view light emitting element 100 according to one embodiment of the disclosure. As shown in FIG. 1, in the embodiment, the side-view light emitting element 100 includes a support substrate 110, a first cladding layer 120, a light emitting multilayer unit 160 and a second cladding layer 140. The first cladding layer 120 is disposed on the support substrate 110. The second cladding layer 140 is disposed on the first cladding layer 120. A refractive index (n) of the first cladding layer 120 and a refractive index (n) of the second cladding layer 140 are between 1 and 0, respectively. The light emitting multilayer unit 160 is sandwiched between the first cladding layer 120 and the second cladding layer 140. The light emitting multilayer unit 160 includes a first semiconductor layer 161, a second semiconductor layer 162 and an activating layer 163 sandwiched between the first semiconductor layer 161 and the second semiconductor layer 162.

Therefore, since the first cladding layer 120 and the second cladding layer 140 of the side-view light emitting element 100 of the embodiment are with better refractive index (1>n>0), respectively, not only the light confinement abilities of the side-view light emitting element 100 can be increased, but also the side-view light emitting element 100 will not be cracked easily.

Furthermore, in the embodiment, the side-view light emitting element 100 further includes a first insulation layer 170 and a second insulation layer 180. The first insulation layer 170 is disposed between the first cladding layer 120 and the first semiconductor layer 161. The first insulation layer 170 is formed with a first interval space 171 which penetrates through two opposite main surfaces of the first insulation layer 170. The first cladding layer 120 is provided with a first extending portion 130. The first extending portion 130 is partially formed convexly on one surface of the first cladding layer 120, and the first extending portion 130 extends into the first interval space 171. The second insulation layer 180 is disposed between the second cladding layer 140 and the second semiconductor layer 162. The second insulation layer 180 is formed with a second interval space 181 which penetrates through two opposite main surfaces of the second insulation layer 180. The second cladding layer 140 is provided with a second extending portion 150. The second extending portion 150 is partially formed convexly on one surface of the second cladding layer 140, and the second extending portion 150 extends into the second interval space 181.

In the embodiment, specifically, the first cladding layer 120 is formed with a first surface 121 and a second surface 122 which are opposite to each other. The first surface 121 of the first cladding layer 120 is fully contacted with the support substrate 110. The first extending portion 130 is located on one part of the second surface 122 of the first cladding layer 120, and the first extending portion 130 extends into the first interval space 171 in a direction being away from the support substrate 110. The first extending portion 130 extending in the first interval space 171 is in contact with the first semiconductor layer 161. For example, the thickness of the first extending portion 130 is 1.5 μm.

The other part (i.e., remaining area) of the second surface 122 of the first cladding layer 120 is contacted with the first insulation layer 170. The second cladding layer 140 is formed with a third surface 141 and a fourth surface 142 which are opposite to each other. The fourth surface 142 of the second cladding layer 140 is closer to the support substrate 110 than the third surface 141 of the second cladding layer 140. The second extending portion 150 is located on one part of the fourth surface 142 of the second cladding layer 140, and the second extending portion 150 extends into the second interval space 181 in a direction facing towards the support substrate 110. The second extending portion 150 extending in the second interval space 181 is in contact with the second semiconductor layer 162. For example, the thickness of the second extending portion 150 is 1.5 μm. The other part (i.e., remaining area) of the fourth surface 142 of the second cladding layer 140 is contacted with the second insulation layer 180.

Also, in the embodiment, the first extending portion 130 is fully filled in the first interval space 171, and the first extending portion 130 and the first interval space 171 are substantially the same in width. The second extending portion 150 is fully filled in the second interval space 181, and the second extending portion 150 and the second interval space 181 are substantially the same in width. However, the disclosure is not limited thereto, in another embodiment, a width of the first extending portion also can be lesser than a width of the first interval space, and a width of the second extending portion also can be lesser than a width of the second interval space.

It is noted, the first extending portion 130 is one part of the first cladding layer 120, and the first extending portion 130 has the same material with the first cladding layer 120. The second extending portion 150 is one part of the second cladding layer 140, and the second extending portion 150 has the same material with the second cladding layer 140.

Moreover, in the embodiment, one surface of the first extending portion 130 facing towards the light emitting multilayer unit 160 and received in the first interval space 171 is a first light reflection surface 131. One surface of the second extending portion 150 facing towards the light emitting multilayer unit 160 and received in the second interval space 181 is a second light reflection surface 151. The first light reflection surface 131 (i.e., the first extending portion 130) and the second light reflection surface 151 (i.e., the second extending portion 150) are respectively shaped as an elongated shape, and the first light reflection surface 131 (i.e., the first extending portion 130) and the second light reflection surface 151 (i.e., the second extending portion 150) are substantially the same in width. The first light reflection surface 131 (i.e., the first extending portion 130) and the second light reflection surface 151 (i.e., the second extending portion 150) are aligned to each there, that is, a first orthographic projection of the first light reflection surface 131 (i.e., the first extending portion 130) to the support substrate 110 is overlapped with a second orthographic projection of the second light reflection surface 151 (i.e., the second extending portion 150) to the support substrate 110. Since light waves repeatedly oscillating in the light emitting multilayer unit 160 are confined in an area (e.g., resonant cavity R) defined between the second light reflection surface 151 and the first light reflection surface 131 which are aligned to each other, the photon density of the resonant cavity R is therefore increased so as to amplify the intensity of the coherent lights repeatedly oscillating in the light emitting multilayer unit 160. However, in another embodiment, as long as the aforementioned resonant cavity can be partitioned by the first light reflection surface and the second light reflection surface, the material of the first light reflection surface also can be different to the material of the first cladding layer, and the material of the second light reflection surface also can be different to the material of the second cladding layer.

Therefore, after the side-view light emitting element 100 is made, the first cladding layer 120 and the second cladding layer 140 can be seen as a first electrode layer and a second electrode layer, respectively, so that the first cladding layer 120 and the second cladding layer 140 of the side-view light emitting element 100 can be a positive electrode and a negative electrode of the side-view light emitting element 100. Thus, the first surface 121 of the first cladding layer 120 of the side-view light emitting element 100 is electrically connected to a circuit board (not shown in figures) through the support substrate 110, and the third surface 141 of the second cladding layer 140 is electrically connected to the circuit board through wires (not shown in figures). The third surface 141 of the second cladding layer 140 is integrally formed as a side surface of the side-view light emitting element 100. It is noted, although the support substrate 110 is an electrically conductive substrate in the embodiment, for example, a silicon carbide (SiC) substrate, however, the disclosure is not limited thereto, in another embodiment, the support substrate 110 does not have to be an electrically conductive substrate, and the first and second cladding layers can be electrically connected to the circuit board through another wires.

In the embodiment, the material of the first cladding layer 120 and the material of the second cladding layer 140 are substantially the same. For example, each of the first cladding layer 120 and the second cladding layer 140 is a silver layer (or called pure silver layer) with 99.9% purity and refractive index (n) of the silver layer is 0.18, for example. When each of the first cladding layer 120 and the second cladding layer 140 is the so-called silver layer (or called pure silver layer), each of the first cladding layer 120 and the second cladding layer 140 not only is provided with lower refractive index (n) and better light confinement ability, but also provided with lower Ohmic contact resistivity.

However, in another embodiment, each of the first cladding layer 120 and the second cladding layer 140 also can be an aluminum layer (or called pure aluminum layer) with 99.9% purity and refractive index (n) of the silver layer is 0.5, for example; alternatively, the material of the first cladding layer 120 and the material of the second cladding layer 140 also can be different; alternatively, the first cladding layer 120 and the second cladding layer 140 are substantially the same in thickness so that the first cladding layer 120 and the second cladding layer 140 have the same light confinement ability; alternatively, the first cladding layer 120 and the second cladding layer 140 also can be different in thickness. Also, in one another embodiment, as long as the first light reflection surface and the second light reflection surface can define the aforementioned resonant cavity, the first light reflection surface and the second light reflection surface can be respectively arranged to be a silver or aluminum layer only, not all of the first electrode layer and the second electrode layer.

It is noted, in the embodiment, the light emitting multilayer unit 160 is directly sandwiched between the first cladding layer 120 and the second cladding layer 140 so that the resonant cavity R is only formed in a part of light emitting multilayer unit 160 between the first cladding layer 120 and the second cladding layer 140, thereby shortening the traveling distance that the light waves transverse in the resonant cavity R so as to enhance the light emitting performance of the side-view light emitting element 100. In addition, the support substrate 110 is not the growth substrate for growing the light emitting multilayer unit 160.

Also, in the embodiment, the activating layer 163 is not limited to be a single-quantum well (SQW) or a multi-quantum well (MQWs) necessarily, and the first semiconductor layer 161 is a P-type semiconductor layer, the second semiconductor layer 162 is an N-type semiconductor layer. However, in another embodiment, the first semiconductor layer 161 is not limited to be an N-type semiconductor layer, the second semiconductor layer 162 is not limited to be a P-type semiconductor layer. Since the specific types of the light emitting multilayer unit are common to those of ordinary skill in the art, it will not be further described in details.

Figure 2A:
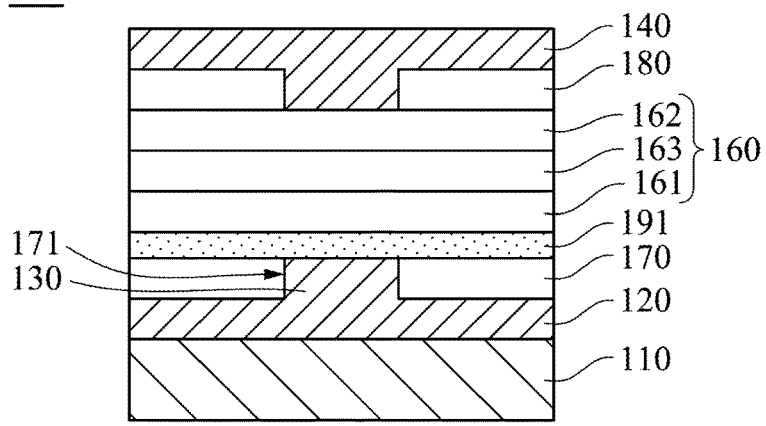
FIG. 2A to FIG. 2C are schematic sectional views of side-view light emitting elements according to plural embodiments of the disclosure.

FIG. 2A is a schematic sectional view of a side-view light emitting element 101 according to one embodiment of the disclosure. The side-view light emitting element 101 of FIG. 2A and the side-view light emitting element 100 of FIG. 1 are substantially the same, expect that the side-view light emitting element 101 of FIG. 2A further includes a first conductive layer 191. The first conductive layer 191 and the first cladding layer 120 are the same in width, and the first conductive layer 191 is disposed between the first cladding layer 120 and the first semiconductor layer 161, and is electrically connected to the first cladding layer 120 and the first semiconductor layer 161. The first conductive layer 191 is light-transmissive, and a refractive index (n) of the first conductive layer 191 is, for example, in a range of 1 to 2.1 so that the first conductive layer 191 and the first cladding layer 120 collaboratively enhance the light confinement ability thereof. For example, the first conductive layer 191 includes a conductive oxide (e.g., indium tin oxide, ITO) or a conductive nitride (e.g., titanium nitride, TiN).

Precisely, the first conductive layer 191 is levelly sandwiched between the first extending portion 130 and the first semiconductor layer 161, and between the first insulation layer 170 and the first semiconductor layer 161. Furthermore, the first conductive layer 191 is totally disposed out of the first interval space 171, and one surface of the first conductive layer 191 fully covers one surface of the first semiconductor layer 161 opposite to the activating layer 163, one part of the opposite surface of the first conductive layer 191 is in contact with the first extending portion 130, the remaining part of the opposite surface of the first conductive layer 191 is in contact with the first insulation layer 170.

Thus, since the first conductive layer 191 of the embodiment is levelly formed between the first extending portion 130 and the first semiconductor layer 161, thus, while forming the first conductive layer 191, overly complex processes are not needed so as to shorten process time and cost.

Figure 2B:
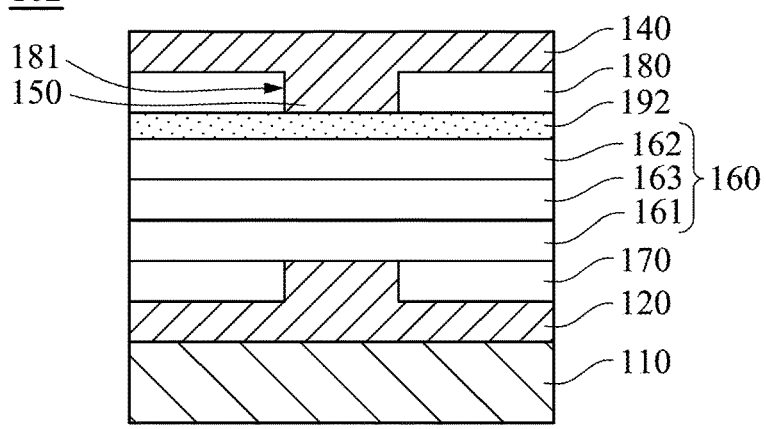

FIG. 2B is a schematic sectional view of a side-view light emitting element 102 according to one embodiment of the disclosure. The side-view light emitting element 102 of FIG. 2B and the side-view light emitting element 100 of FIG. 1 are substantially the same, expect that the side-view light emitting element 102 of FIG. 2B further includes a second conductive layer 192. The second conductive layer 192 and the second cladding layer 140 are the same in width, and the second conductive layer 192 is disposed between the second cladding layer 140 and the second semiconductor layer 162, and is electrically connected to the second cladding layer 140 and the second semiconductor layer 162. The second conductive layer 192 is light-transmissive, and a refractive index (n) of the second conductive layer 192 is, for example, in a range of 1 to 2.1 so that the second conductive layer 192 and the second cladding layer 140 collaboratively enhance the light confinement ability thereof. For example, the second conductive layer 192 includes a conductive oxide (e.g., indium tin oxide, ITO) or a conductive nitride (e.g., titanium nitride, TiN).

Precisely, the second conductive layer 192 is levelly sandwiched between the second extending portion 150 and the second semiconductor layer 162, and between the second insulation layer 180 and the second semiconductor layer 162. Furthermore, the second conductive layer 192 is totally disposed out of the second interval space 181, and one surface of the second conductive layer 192 fully covers one surface of the second semiconductor layer 162 opposite to the activating layer 163, one part of the opposite surface of the second conductive layer 192 is in contact with the second extending portion 150, the remaining part of the opposite surface of the second conductive layer 192 is in contact with the second insulation layer 180.

Thus, since the second conductive layer 192 of the embodiment is levelly formed between the second extending portion 150 and the second semiconductor layer 162, thus, while forming the second conductive layer 192, overly complex processes are not needed so as to shorten process time and cost.

Figure 2C:
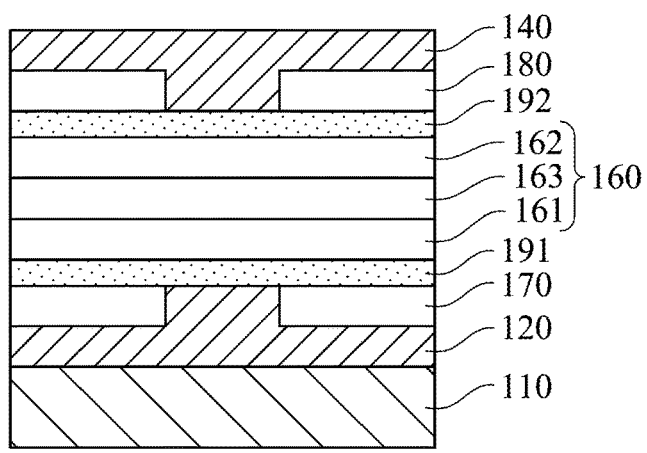

FIG. 2C is a schematic sectional view of a side-view light emitting element 103 according to one embodiment of the disclosure. The side-view light emitting element 103 of FIG. 2C is substantially the same as the side-view light emitting element 101 of FIG. 2A and the side-view light emitting element 102 of FIG. 2B, expect that the side-view light emitting element 103 of FIG. 2C includes a first conductive layer 191 and a second conductive layer 192 so that the light emitting multilayer unit 160 is directly sandwiched between the first conductive layer 191 and the second conductive layer 192, and the light emitting multilayer unit 160 is electrically connected to the first cladding layer 120 through the first conductive layer 191, and electrically connected to the second cladding layer 140 through the second conductive layer 192. Also, the first conductive layer 191 and the second conductive layer 192 in the embodiment are aligned with each other and are arranged in parallel. Thus, different from the side-view light emitting element 101 of FIG. 2A and the side-view light emitting element 102 of FIG. 2B only configured with single one conductive layer 191 or 192, the side-view light emitting element 103 of the embodiment is configured with both of the first conductive layer 191 and the second conductive layer 192 which are parallel to each other so as to provide greater light confinement ability.

Figure 3A:
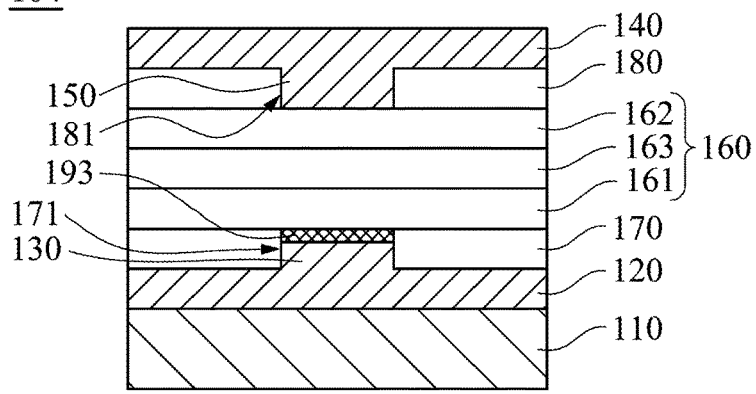
FIG. 3A to FIG. 3C are schematic sectional views of side-view light emitting elements according to plural embodiments of the disclosure.

FIG. 3A is a schematic sectional view of a side-view light emitting element 104 according to one embodiment of the disclosure. The side-view light emitting element 104 of FIG. 3A and the side-view light emitting element 100 of FIG. 1 are substantially the same, except that the side-view light emitting element 104 of FIG. 3A further includes a first conductive layer 193. The first conductive layer 193 is only entirely received in the first interval space 171, and the first conductive layer 193 is directly sandwiched between the first extending portion 130 and the first semiconductor layer 161 so as to be electrically connected to the first extending portion 130 and the first semiconductor layer 161. In the embodiment, the whole first conductive layer 193 is filled in the first interval space 171, that is, the first conductive layer 193 and the first interval space 171 are substantially the same in width.

The second extending portion 150 is fully filled in the second interval space 181, and the second extending portion 150 and the second interval space 181 are substantially the same in width. However, the disclosure is not limited thereto, in another embodiment, a width of the first conductive layer also can be lesser than a width of the first interval space. Furthermore, the first conductive layer 193 is light-transmissive, and a refractive index (n) of the first conductive layer 193 is, for example, in a range of 1 to 2.1 so that the first conductive layer 193 and the first cladding layer 120 collaboratively enhance the light confinement ability thereof. For example, the first conductive layer 193 includes a conductive oxide (e.g., indium tin oxide, ITO) or a conductive nitride (e.g., titanium nitride, TiN). Thus, while forming the first conductive layer 193, process time and cost can be saved.

Figure 3B:
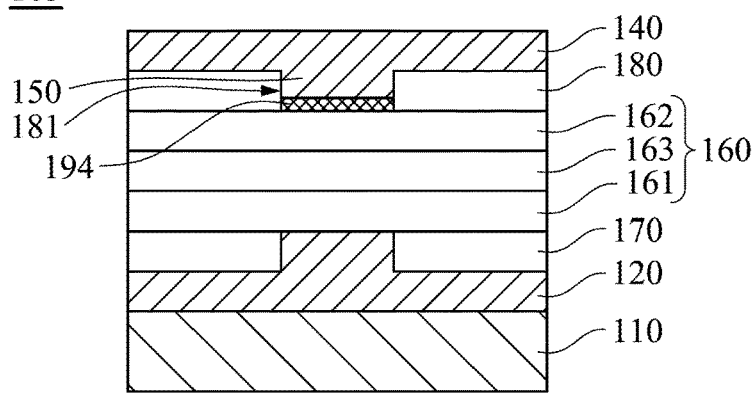

FIG. 3B is a schematic sectional view of a side-view light emitting element 105 according to one embodiment of the disclosure. The side-view light emitting element 105 of FIG. 3B and the side-view light emitting element 100 of FIG. 1 are substantially the same, except that the side-view light emitting element 105 of FIG. 3B further includes a second conductive layer 194. The second conductive layer 194 is only entirely received in the second interval space 181, and the second conductive layer 194 is directly sandwiched between the second extending portion 150 and the second semiconductor layer 162 so as to be electrically connected to the second extending portion 150 and the second semiconductor layer 162. In the embodiment, the whole second conductive layer 194 is filled in the second interval space 181, that is, the second conductive layer 194 and the second interval space 181 are substantially the same in width. However, the disclosure is not limited thereto, in another embodiment; a width of the second conductive layer also can be lesser than a width of the second interval space. Furthermore, the second conductive layer 194 is light-transmissive, and a refractive index (n) of the second conductive layer 194 is, for example, in a range of 1 to 2.1 so that the second conductive layer 194 and the second cladding layer 140 collaboratively enhance the light confinement ability thereof. For example, the second conductive layer 194 includes a conductive oxide (e.g., indium tin oxide, ITO) or a conductive nitride (e.g., titanium nitride, TiN). Thus, while forming the second conductive layer 194, process time and cost can be saved.

Figure 3C:
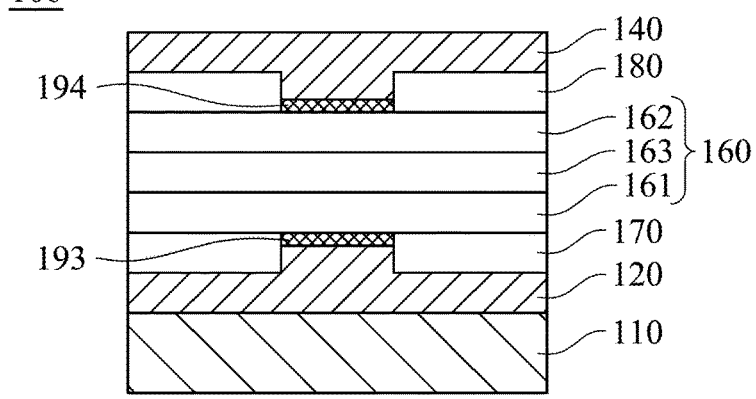

FIG. 3C is a schematic sectional view of a side-view light emitting element 106 according to one embodiment of the disclosure. The side-view light emitting element 106 of FIG. 3C is substantially the same with the side-view light emitting element 104 of FIG. 3A and the side-view light emitting element 105 of FIG. 3B, except that the side-view light emitting element 106 of FIG. 3C further includes a first conductive layer 193 and a second conductive layer 194 so that the light emitting multilayer unit 160 is directly sandwiched between the first conductive layer 193 and the second conductive layer 194, and the light emitting multilayer unit 160 is electrically connected to the first cladding layer 120 through the first conductive layer 193, and electrically connected to the second cladding layer 140 through the second conductive layer 194. Also, the first conductive layer 193 and the second conductive layer 194 in the embodiment are aligned with each other and are arranged in parallel.

Thus, different from the side-view light emitting element 104 of FIG. 3A and the side-view light emitting element 105 of FIG. 3B only configured with single one conductive layer 193 or 194, the side-view light emitting element 106 of the embodiment is configured with both of the first conductive layer 193 and the second conductive layer 194 which are parallel to each other so as to provide greater light confinement ability.

Figure 4A:
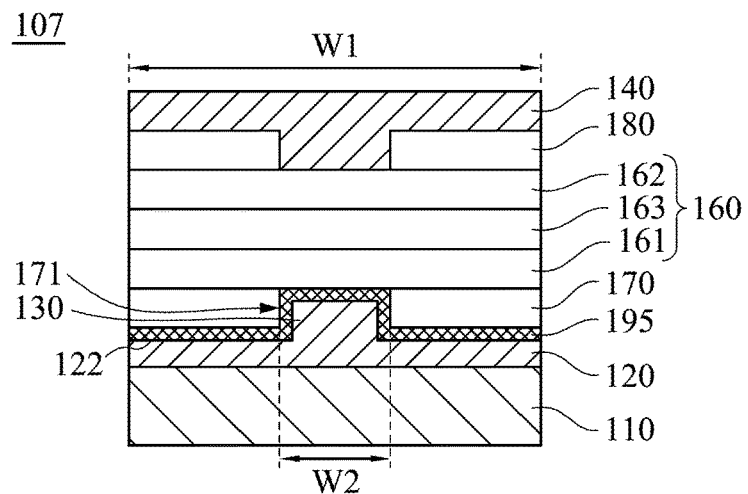
FIG. 4A to FIG. 4C are schematic sectional views of side-view light emitting elements according to plural embodiments of the disclosure.

FIG. 4A is a schematic sectional view of a side-view light emitting element 107 according to one embodiment of the disclosure. The side-view light emitting element 107 of FIG. 4A and the side-view light emitting element 100 of FIG. 1 are substantially the same, except that the side-view light emitting element 107 of FIG. 4A further includes a first conductive layer 195. A width W1 of the first conductive layer 195 is greater than a width W2 of the first interval space 171, and the first conductive layer 195 is sandwiched between the first cladding layer 120 and the first insulation layer 170, and between the first cladding layer 120 and the first semiconductor layer 161, and the first conductive layer 195 is electrically connected to the first cladding layer 120 and the first semiconductor layer 161. Furthermore, the first conductive layer 195 is light-transmissive, and a refractive index (n) of the first conductive layer 195 is, for example, in a range of 1 to 2.1 so that the first conductive layer 195 and the first cladding layer 120 collaboratively enhance the light confinement ability thereof. For example, the first conductive layer 195 includes a conductive oxide (e.g., indium tin oxide, ITO) or a conductive nitride (e.g., titanium nitride, TiN).

More particularly, the first conductive layer 195 fully covers the second surface 122 of the first cladding layer 120 and the first extending portion 130. One part of the first conductive layer 195 is disposed in the first interval space 171, and is disposed between the first extending portion 130 and the first semiconductor layer 161, and the other part of the first conductive layer 195 is disposed between the second surface 122 of the first cladding layer 120 and the first insulation layer 170. Thus, since the first conductive layer 195 of the embodiment fully covers the second surface 122 of the first cladding layer 120 and the first extending portion 130, thus, while forming the first conductive layer 195, overly complex processes are not needed so as to shorten process time and cost.

Figure 4B:
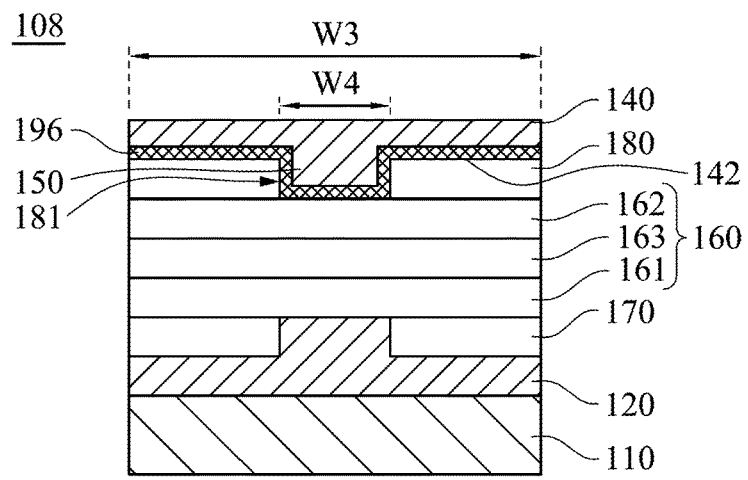

FIG. 4B is a schematic sectional view of a side-view light emitting element 108 according to one embodiment of the disclosure. The side-view light emitting element 108 of FIG. 4B and the side-view light emitting element 100 of FIG. 1 are substantially the same, except that the side-view light emitting element 108 of FIG. 4B further includes a second conductive layer 196. A width W3 of the second conductive layer 196 is greater than a width W4 of the second interval space 181, and the second conductive layer 196 is sandwiched between the second cladding layer 140 and the second insulation layer 180, and between the second cladding layer 140 and the second semiconductor layer 162, and the second conductive layer 196 is electrically connected to the second cladding layer 140 and the second semiconductor layer 162. Furthermore, the second conductive layer 196 is light-transmissive, and a refractive index (n) of the second conductive layer 196 is, for example, in a range of 1 to 2.1 so that the second conductive layer 196 and the second cladding layer 140 collaboratively enhance the light confinement ability thereof. For example, the second conductive layer 196 includes a conductive oxide (e.g., indium tin oxide, ITO) or a conductive nitride (e.g., titanium nitride, TiN).

More particularly, the second conductive layer 196 fully covers the fourth surface 142 of the second cladding layer 140 and the second extending portion 150. One part of the second conductive layer 196 is disposed in the second interval space 181, and is disposed between the second extending portion 150 and the second semiconductor layer 162, and the other part of the second conductive layer 196 is disposed between the fourth surface 142 of the second cladding layer 140 and the second insulation layer 180. Thus, since the second conductive layer 196 of the embodiment fully covers the fourth surface 142 of the second cladding layer 140 and the second extending portion 150, thus, while forming the second conductive layer 196, overly complex processes are not needed so as to shorten process time and cost.

Figure 4C:
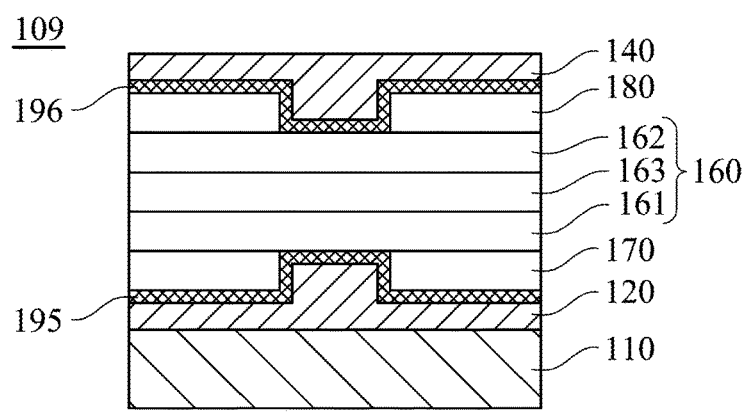

FIG. 4C is a schematic sectional view of a side-view light emitting element 109 according to one embodiment of the disclosure. The side-view light emitting element 109 of FIG. 4C is substantially the same with the side-view light emitting element 107 of FIG. 4A and the side-view light emitting element 108 of FIG. 4B, except that the side-view light emitting element 109 of FIG. 4C further includes a first conductive layer 195 and a second conductive layer 196 so that the light emitting multilayer unit 160 is directly sandwiched between the first conductive layer 195 and the second conductive layer 196, and the light emitting multilayer unit 160 is electrically connected to the first cladding layer 120 through the first conductive layer 195, and electrically connected to the second cladding layer 140 through the second conductive layer 196. Also, the first conductive layer 195 and the second conductive layer 196 in the embodiment are aligned with each other and are arranged in parallel.

Thus, different from the side-view light emitting element 107 of FIG. 4A and the side-view light emitting element 108 of FIG. 4B only configured with single one conductive layer 195 or 196, the side-view light emitting element 109 of the embodiment is configured with both of the first conductive layer 195 and the second conductive layer 196 which are parallel to each other so as to provide greater light confinement ability.

Also, it is noted, each of the aforementioned side-view light emitting elements is not limited to a light emitting diode (LED) or a laser diode.

Figure 5:
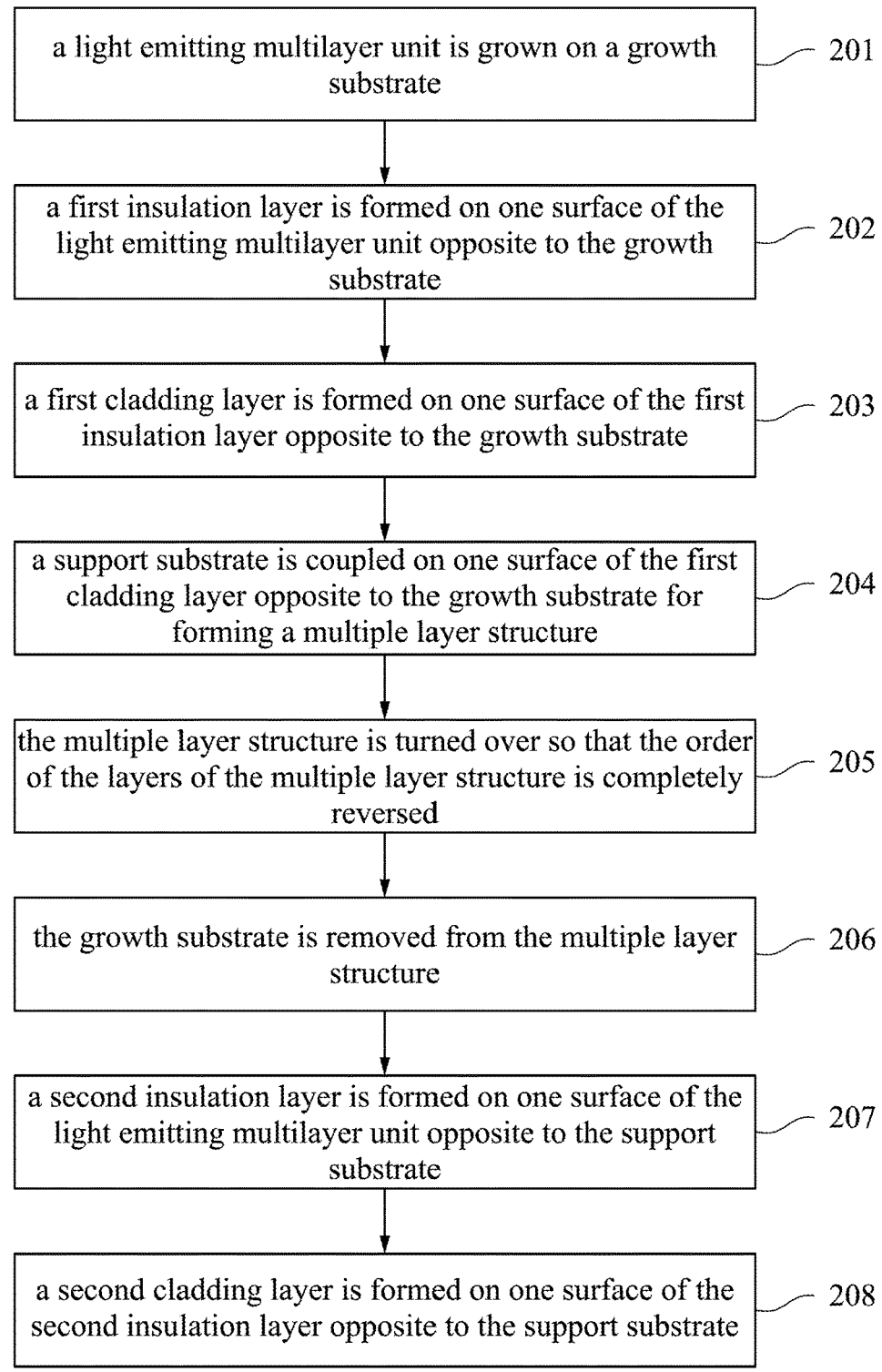
FIG. 5 is a flow chart of a manufacturing method of a side-view light emitting element according to one embodiment of the disclosure.
Figure 6A:
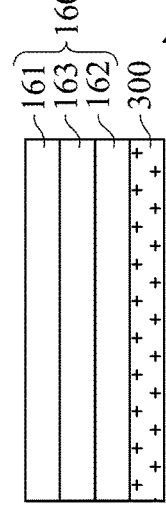
FIG. 6A-FIG. 6F are operational schematic views of FIG. 5.
Figure 6B:
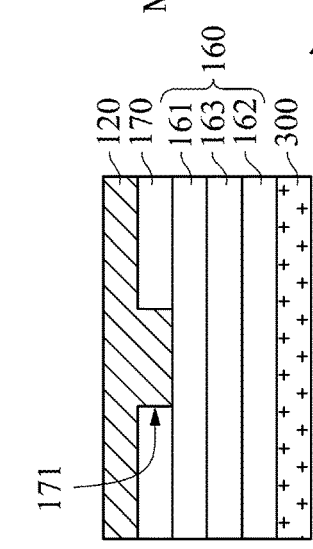
Figure 6C:
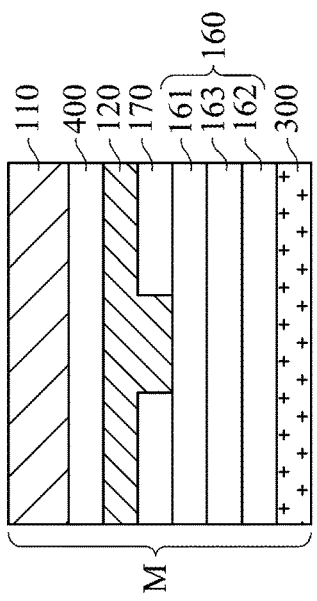
Figure 6D:
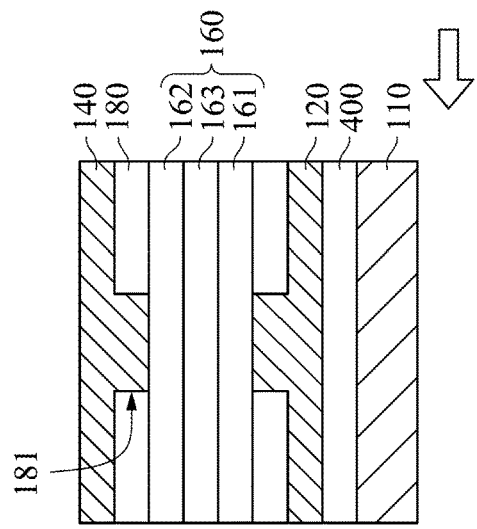
Figure 6E:
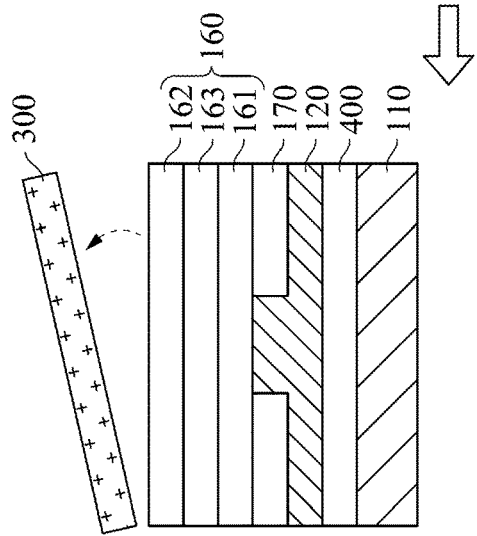
Figure 6F:
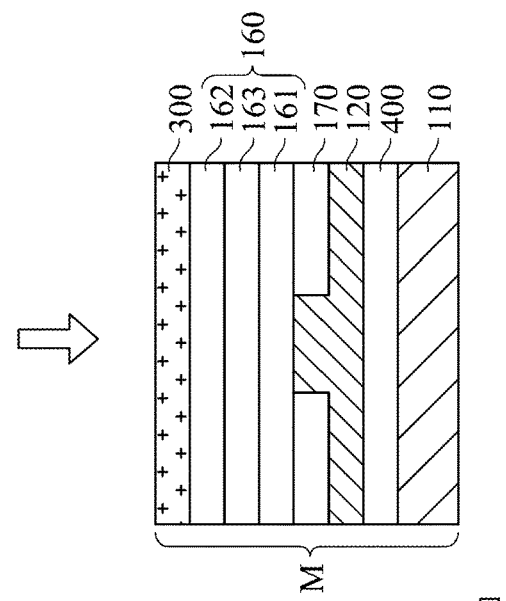

FIG. 5 is a flow chart of a manufacturing method of a side-view light emitting element according to one embodiment of the disclosure. FIG. 6A-FIG. 6F are operational schematic views of FIG. 5. As shown in FIG. 5, the manufacturing method of the side-view light emitting element includes step 201 to step 208 as follows. In step 201, as shown in FIG. 6A, a light emitting multilayer unit 160 is grown on a growth substrate 300. In step 202, as shown in FIG. 6B, a first insulation layer 170 is formed on one surface of the light emitting multilayer unit 160 opposite to the growth substrate 300. In step 203, as shown in FIG. 6B, a first cladding layer 120 is formed on one surface of the first insulation layer 170 opposite to the growth substrate 300. In step 204, as shown in FIG. 6C, a support substrate 110 is coupled on one surface of the first cladding layer 120 opposite to the growth substrate 300 for forming a multiple layer structure M. In step 205, as shown in FIG. 6D, the above-mentioned multiple layer structure M is turned over so that the order of the layers of the multiple layer structure M formed in step 204 is completely reversed. In step 206, as shown in FIG. 6E, the growth substrate 300 is removed from the above-mentioned multiple layer structure M. In step 207, as shown in FIG. 6F, a second insulation layer 180 is formed on one surface of the light emitting multilayer unit 160 opposite to the support substrate 110. In step 208, as shown in FIG. 6F, a second cladding layer 140 is formed on one surface of the second insulation layer 180 opposite to the support substrate 110.

More specifically, in one of embodiments, as shown in FIG. 6A, in step 201, the growth substrate 300, for example, is a sapphire substrate, and the light emitting multilayer unit 160, for example, can be any of the light emitting multilayer units 160 mentioned in the above embodiments, and the light emitting multilayer unit 160 includes a first semiconductor layer 161 (e.g., P-type semiconductor layer), an activating layer 163 (e.g., multi-quantum well, MQWs) and a second semiconductor layer 162 (e.g., N-type semiconductor layer) which are stacked in sequence, and the second semiconductor layer 162 (e.g., N-type semiconductor layer) is interposed between the activating layer 163 (e.g., multi-quantum well, MQWs) and the growth substrate 300.

In one of embodiments, as shown in FIG. 6B, a first interval space 171 mentioned in step 202 is formed in the first insulation layer 170, and the first cladding layer 120 formed on the first insulation layer 170 mentioned in step 203 further is fully filled in the first interval space 171.

In one of embodiments, as shown in FIG. 6C, the support substrate 110 mentioned in step 204 is coupled on the first cladding layer 120 through an adhesive layer 400 including materials such as titanium, tungsten etc.

In one of embodiments, as shown in FIG. 6D, the multiple layer structure M mentioned in step 205 is turned over to be upside down in 180 degrees so that the order of the layers of the multiple layer structure M formed in step 204 is completely reversed.

In one of embodiments, as shown in FIG. 6E, the growth substrate 300 mentioned in step 206 is peeled off from the above-mentioned multiple layer structure M by laser beams.

In one of embodiments, as shown in FIG. 6F, a second interval space 181 mentioned in step 207 is formed in the second insulation layer 180, and the second cladding layer 140 formed on the second insulation layer 180 mentioned in step 208 further is fully filled in the second interval space 181.

In other embodiments, refer to FIG. 2A, FIG. 3A or FIG. 4A, a step of forming a first conductive layer 191, 193 or 195 on the first insulation layer 170 by appropriately adjusting the area and the location of the first conductive layer according to FIG. 2A, FIG. 3A or FIG. 4A can be performed between step 202 and step 203.

In other embodiments, refer to FIG. 2B, FIG. 3B or FIG. 4B, a step of forming a second conductive layer 192, 194 or 196 on the second insulation layer 180 by appropriately adjusting the area and the location of the second conductive layer according to FIG. 2B, FIG. 3B or FIG. 4B can be performed between step 207 and step 208.

In other embodiments, refer to FIG. 2C, FIG. 3C or FIG. 4C, a step of forming a first conductive layer 191, 193 or 195 on the first insulation layer 170 by appropriately adjusting the area and the location of the first conductive layer according to FIG. 2C, FIG. 3C or FIG. 4C can be performed between step 202 and step 203, and a step of forming a second conductive layer 192, 194 or 196 on the second insulation layer 180 by appropriately adjusting the area and the location of the second conductive layer according to FIG. 2C, FIG. 3C or FIG. 4C can be performed between step 207 and step 208.

It is noted, as known in the aforementioned method, after the first cladding layer 120 (step 203) is formed on one surface of the light emitting multilayer unit 160 opposite to the growth substrate 300, the growth substrate 300 can be removed from the above-mentioned multiple layer structure M, and the second cladding layer 140 can be formed on the same side of the above-mentioned multiple layer structure M which the growth substrate 300 has been removed so as to provide a side-view light emitting element with a light emitting multilayer unit having cladding layers at two opposite sides thereof.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A side-view light emitting laser element, comprising:
    a support substrate;
    a first electrode layer disposed on the support substrate, wherein one surface of the first electrode layer opposite to the support substrate is partially formed with a first extending portion, the first extending portion has a first light reflection surface which is disposed on one surface of the first extending portion opposite to the support substrate;
    a second electrode layer disposed on the first electrode layer;
    a light emitting multilayer unit sandwiched between the first electrode layer and the second electrode layer, and the second electrode layer fully covering the light emitting multilayer unit, the light emitting multilayer unit comprising a first semiconductor layer, a second semiconductor layer and an activating layer sandwiched between the first semiconductor layer and the second semiconductor layer,
    a first insulation layer disposed between the first electrode layer and the first semiconductor layer, and formed with a first interval space, wherein the first light reflection surface is received in the first interval space; and
    a second insulation layer disposed between the second electrode layer and the second semiconductor layer, and formed with a second interval space,
    wherein one surface of the second electrode layer facing towards the light emitting multilayer unit is partially formed with a second extending portion, the first extending portion and the second extending portion respectively extend towards the light emitting multilayer unit, the second extending portion has a second light reflection surface which is received in the second interval space, and disposed on one surface of the second extending portion facing towards the support substrate, and a first orthographic projection of the first light reflection surface to the support substrate is overlapped with a second orthographic projection of the second light reflection surface to the support substrate, and a resonant cavity is defined between the second light reflection surface and the first light reflection surface for confining light waves and repeatedly oscillating the light waves so as to convert and discharge laser lights from the resonant cavity outwardly, wherein a first refractive index of the first electrode layer and a second refractive index of the second electrode layer are between 1 and 0, respectively.

2. The side-view light emitting laser element of claim 1, wherein the first electrode layer is a silver layer or an aluminum layer, and the second electrode layer is a silver layer or an aluminum layer.

3. The side-view light emitting laser element of claim 1, further comprising:
    a first conductive layer disposed between the first electrode layer and the first semiconductor layer, wherein a third refractive index of the first conductive layer is in a range of 1 to 2.1.

4. The side-view light emitting laser element of claim 3, wherein the first conductive layer is disposed between the first light reflection surface and the first semiconductor layer, and only entirely received in the first interval space.

5. The side-view light emitting laser element of claim 3, wherein the first conductive layer fully covers the one surface of the first electrode layer and the first extending portion, wherein one part of the first conductive layer is disposed in the first interval space, and is disposed between the first light reflection surface and the first semiconductor layer, and the other part of the first conductive layer is disposed between the one surface of the first electrode layer and the first insulation layer.

6. The side-view light emitting laser element of claim 3, wherein the first conductive layer is levelly sandwiched between the first light reflection surface and the first semiconductor layer, and between the first insulation layer and one surface of the first semiconductor layer,
    wherein the first conductive layer is totally disposed out of the first interval space, and the first conductive layer fully covers one surface of the first semiconductor layer opposite to the activating layer.

7. The side-view light emitting laser element of claim 1, further comprising:
    a second conductive layer disposed between the second electrode layer and the second semiconductor layer, wherein a fourth refractive index of the second conductive layer is in a range of 1 to 2.1.

8. The side-view light emitting laser element of claim 7, wherein the second conductive layer is disposed between the second light reflection surface and the second semiconductor layer, and only entirely received in the second interval space.

9. The side-view light emitting laser element of claim 7, wherein the second conductive layer fully covers the one surface of the second electrode layer and the second extending portion,
    wherein one part of the second conductive layer is disposed in the second interval space, and is disposed between the second light reflection surface and the second semiconductor layer, and the other part of the second conductive layer is disposed between the one surface of the second electrode layer and the second insulation layer.

10. The side-view light emitting laser element of claim 7, wherein the second conductive layer is levelly sandwiched between the second light reflection surface and the second semiconductor layer, and between the second insulation layer and one surface of the second semiconductor layer,
    wherein the second conductive layer is totally disposed out of the second interval space, and the second conductive layer fully covers one surface of the second semiconductor layer opposite to the activating layer.

11. The side-view light emitting laser element of claim 1, wherein the side-view light emitting laser element comprises a cuboid body, and the side-view light emitting laser element is provided with a short side-surface, and the resonant cavity is in an elongated shape, wherein a first long axial direction of the cuboid body is parallel to a second long axial direction of the resonant cavity, and the laser lights of the resonant cavity are discharged outwardly from the short side-surface of the side-view light emitting laser element.

* * * * *